United States Patent
Toshiyuki et al.

(10) Patent No.: US 9,628,072 B2
(45) Date of Patent: Apr. 18, 2017

(54) DRIVING DEVICE AND SWITCHING CIRCUIT CONTROL METHOD

(71) Applicants: Ken Toshiyuki, Seto (JP); Tokuro Tsutsui, Okazaki (JP)

(72) Inventors: Ken Toshiyuki, Seto (JP); Tokuro Tsutsui, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/772,275

(22) PCT Filed: Mar. 3, 2014

(86) PCT No.: PCT/JP2014/055326
§ 371 (c)(1),
(2) Date: Sep. 2, 2015

(87) PCT Pub. No.: WO2014/174901
PCT Pub. Date: Oct. 30, 2014

(65) Prior Publication Data
US 2016/0036433 A1    Feb. 4, 2016

(30) Foreign Application Priority Data
Apr. 26, 2013    (JP) .................... 2013-094312

(51) Int. Cl.
*H03K 3/00*    (2006.01)
*H03B 1/00*    (2006.01)
(Continued)

(52) U.S. Cl.
CPC ............ *H03K 17/567* (2013.01); *H02M 1/08* (2013.01); *H02M 7/538* (2013.01); *H03K 5/24* (2013.01);
(Continued)

(58) Field of Classification Search
CPC . H03K 17/567; H03K 19/017509; H03K 5/24
(Continued)

(56) References Cited

U.S. PATENT DOCUMENTS 6,580,627 B2    6/2003    Toshio
2005/0068089 A1*    3/2005    Balakrishnan .... H02M 3/33592
327/427
(Continued)

FOREIGN PATENT DOCUMENTS

DE    102009030738 A1    12/2010
JP    2007-014059 A    1/2007
(Continued)

*Primary Examiner* — Lincoln Donovan
*Assistant Examiner* — Thomas Skibinski
(74) *Attorney, Agent, or Firm* — Oliff PLC

(57) ABSTRACT

A driving device includes a switching circuit configured to have switching elements disposed on a high side and a low side, the switching element including a first electrode, a second electrode, and a reverse conducting element disposed between the first electrode and the second electrode; and a determination part configured to determine whether to permit the switching element to turn on, based on a result obtained by detecting a voltage between the first electrode and the second electrode, in a period during which the switching elements on both sides are off.

14 Claims, 5 Drawing Sheets

(51) Int. Cl.
H03K 17/567 (2006.01)
H02M 7/538 (2007.01)
H03K 5/24 (2006.01)
H03K 19/0175 (2006.01)
H02M 1/08 (2006.01)
H03K 17/30 (2006.01)
H02M 1/00 (2006.01)

(52) U.S. Cl.
CPC ............... *H03K 19/017509* (2013.01); *H02M 2001/0048* (2013.01); *H03K 2017/307* (2013.01); *Y02B 70/1491* (2013.01)

(58) Field of Classification Search
USPC ............... 327/108–112, 427, 434, 437, 419; 326/82, 83, 87
See application file for complete search history.

(56) References Cited

U.S. PATENT DOCUMENTS

2009/0057832 A1 3/2009 Kouno
2010/0079192 A1 4/2010 Strzalkowski

FOREIGN PATENT DOCUMENTS

JP 2008-072848 A 3/2008
JP 2009-268054 A 11/2009
JP 2012-019550 A 1/2012

\* cited by examiner

US 9,628,072 B2

DRIVING DEVICE AND SWITCHING CIRCUIT CONTROL METHOD

TECHNICAL FIELD

The present invention relates to a driving device that includes a switching circuit having a switching element including a reverse conducting element, and a control method of the switching circuit.

BACKGROUND ART

Conventionally, a semiconductor device has been known that includes an IGBT element with which a diode element is connected by a reverse conducting connection (see, for example, Patent Document 1). This semiconductor device detects conduction of the diode element, by a sense resistor that is connected with the diode sense element, and includes a feedback circuit that stops driving the IGBT element when a current flows in the diode element.

RELATED-ART DOCUMENTS

Patent Documents

[Patent Document 1] Japanese Laid-open Patent Publication No. 2012-19550

SUMMARY OF THE INVENTION

Problem to be Solved by Invention

However, the current flowing in the sense resistor, and the resistance value of the sense resistor are small, and a voltage value obtained from the sense resistor is small. Therefore, detection precision of conduction of the diode element having the reverse conducting connection with the IGBT element, tends to be reduced. It is an object of the present invention to provide a driving device and a control method of the switching circuit, with which detection precision of conduction of a reverse conducting element is not easily reduced.

Means to Solve the Problem

To achieve the above object, an embodiment of the present invention provides a driving device that includes a switching circuit configured to have switching elements disposed on a high side and a low side, the switching element including a first electrode, a second electrode, and a reverse conducting element disposed between the first electrode and the second electrode; and a determination part configured to determine whether to permit the switching element to turn on, based on a result obtained by detecting a voltage between the first electrode and the second electrode, in a period during which the switching elements on both sides are off.

Also, to achieve the above object, another embodiment of the present invention provides a control method of a switching circuit configured to have switching elements disposed on a high side and a low side, the switching element including a first electrode, a second electrode, and a reverse conducting element disposed between the first electrode and the second electrode. The method includes determining whether to permit the switching element to turn on, based on a result obtained by detecting a voltage between the first electrode and the second electrode, in a period during which the switching elements on both sides are off.

Advantage of the Invention

According to the embodiments of the present invention, detection precision of conduction of a reverse conducting element is not easily reduced.

BRIEF DESCRIPTION OF DRAWINGS

FIG. 3 is a timing chart when a switching element is permitted to turn on;

FIG. 4 is a timing chart when a switching element is inhibited from turning on.

MODE FOR CARRYING OUT THE INVENTION

Figure 1:
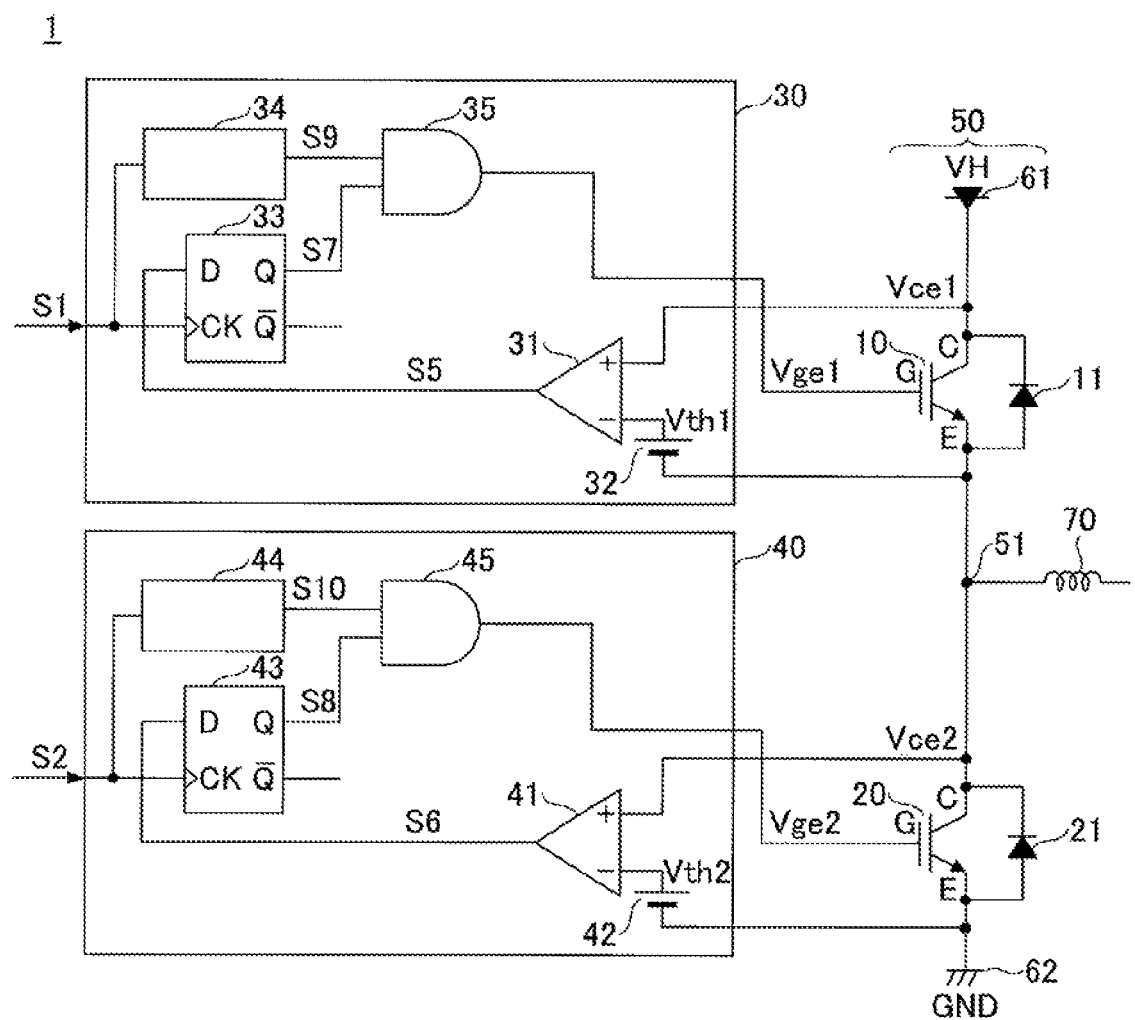
FIG. 1 is a configuration diagram illustrating a driving device according to a first embodiment.

FIG. 1 is a diagram illustrating a configuration of a driving device 1 according to a first embodiment. The driving device 1 is a semiconductor circuit that drives an inductive load (for example, a motor, a reactor, or the like) by driving on and off an upper arm 10 and a lower arm 20. The driving device 1 includes an arm circuit 50 as a switching circuit in which the upper arm 10 and the lower arm 20 are connected in series via an intermediate node 51. One terminal of the load 70 is connected with the intermediate node 51.

The driving device 1 includes the upper arm 10, a first drive control circuit 30 that controls driving the upper arm 10, the lower arm 20, and a second drive control circuit 40 that controls driving the lower arm 20. The upper arm 10 may be a semiconductor element on a substrate common to that for the drive control circuit 30, or a semiconductor element on a substrate different from that for the drive control circuit 30. This is the same for the lower arm 20. Also, the upper arm 10 may be the semiconductor element on the substrate common to that for the lower arm 20, or may be the semiconductor element on the substrate different from that for the lower arm 20.

Although the driving device 1 is assumed to be a semiconductor device constituted in an integrated circuit, it may be a semiconductor device constituted with discrete parts.

Use examples of the driving device 1 include an inverter and a power source apparatus. For example, such an inverter may include multiple driving devices 1, and if including three driving devices 1, it functions as a three-phase inverter.

The upper arm 10 is a switching element disposed on a high side, or on the side of a first power source potential part 61, relative to the intermediate node 51, and the lower arm 20 is a switching element disposed on a low side, or on the side of a second power source potential part 62, relative to the intermediate node 51. The upper arm 10 and the lower arm 20 are connected in series between the power source potential part 61 and the power source potential part 62.

The power source potential part 61 is a high-potential part that is conductively connected with of a positive-polarity terminal of a power source, for example, a battery, a converter, or the like. The power source potential part 62 having a lower potential than that of the power source potential part 61 is a low-potential part (so-called a "ground" or GND) that is conductively connected with of a negative-polarity terminal of the power source, for example, a battery, a converter, or the like, or a grounding part of a vehicle-body. A voltage between the power source potential part 61 and the power source potential part 62 corresponds to a power supply voltage VH of the upper arm 10 and the lower arm 20, and the power supply voltage VH is applied between both terminals of the arm circuit 50 having the upper arm 10 and the lower arm 20 connected in series.

The upper arm 10 and the lower arm 20 are insulation-gate, voltage-controlled semiconductor elements that turn on and off. The upper arm 10 and the lower arm 20 are elements that include control electrodes, first main electrodes, second main electrodes, respectively, and specific examples of these are power transistor elements such as IGBTs, MOSFETs, and the like. In FIG. 1, IGBTs are illustrated as examples of the upper arm 10 and the lower arm 20.

In the following, for the sake of explanation, the upper arm 10 and the lower arm 20 are assumed to be IGBTs. In a case of MOSFETs, the following description can be read by replacing a "collector" with a "drain", and an "emitter" with a "source".

The gate electrode G of the upper arm 10 is, for example, a control electrode that is connected with the drive control circuit 30 via a gate resistor (not illustrated) connected in series with the gate electrode G. The collector electrode C of the upper arm 10 is a first main electrode that is connected with the power source potential part 61. The emitter electrode E of the upper arm 10 is a second main electrode that is connected with the power source potential part 62 via the intermediate node 51 and the lower arm 20.

The gate electrode G of the lower arm 20 is, for example, a control electrode that is connected with the drive control circuit 40 via a gate resistor (not illustrated) connected in series with the gate electrode G. The collector electrode C of the lower arm 20 is a first main electrode that is connected with the power source potential part 61 via the intermediate node 51 and the upper arm 10. The emitter electrode E of the lower arm 20 is a second main electrode that is connected with the power source potential part 62.

The upper arm 10 includes a diode 11 for reverse conducting as a reverse conducting element disposed between the collector electrode C and the emitter electrode E. The diode 11 is an element connected with the upper arm 10 by a reverse conducting connection, and includes a cathode connected with the collector electrode C of the upper arm 10, and an anode connected with the emitter electrode E of the upper arm 10.

The lower arm 20 includes a diode 21 for reverse conducting as a reverse conducting element disposed between the collector electrode C and the emitter electrode E. The diode 21 is an element connected with the lower arm 20 by a reverse conducting connection, and includes a cathode connected with the collector electrode C of the lower arm 20, and an anode connected with the emitter electrode E of the lower arm 20.

The upper arm 10 and the lower arm 20 are, for example, diode-built-in IGBTs. In this case, the upper arm 10 is an IGBT having the diode 11 built in, and the lower arm 20 is an IGBT having the diode 21 built in.

A diode-built-in IGBT is a reverse conducting IGBT (RC (Reverse Conducting)-IGBT) that has an IGBT element and a diode element disposed on a common semiconductor substrate. The diode-built-in IGBT has a structure in which the anode electrode of the diode element and the emitter electrode of the IGBT element constitute a common electrode, and the cathode electrode of the diode element and the collector electrode of the IGBT element constitute another common electrode.

Note that the diode 11 may be a diode additionally connected in parallel with the upper arm 10, or may be a body diode that is a parasitic element formed between the collector electrode C and the emitter electrode E. This is the same for the diode 21.

The drive control circuit 30 includes a driving circuit 34 that outputs, following a command signal S1 supplied from the outside, a control signal S9 that controls a gate voltage Vge1 of the gate electrode G of the upper arm 10 to be a voltage value for turning on or off the upper arm 10, via the gate resistor (not illustrated). The drive control circuit 30 is, for example, a driving IC that includes the driving circuit 34. The gate voltage Vge1 is a control voltage that is applied between the gate electrode G and the emitter electrode E of the upper arm 10. The upper arm 10 turns on or off, depending on a voltage value of the gate voltage Vge1.

The drive control circuit 40 includes a driving circuit 44 that outputs, following a command signal S2 supplied from the outside, a control signal S10 that controls a gate voltage Vge2 of the gate electrode G of the lower arm 20 to be a voltage value for turning on or off the lower arm 20, via the gate resistor (not illustrated). The drive control circuit 40 is, for example, a driving IC that includes the driving circuit 44. The gate voltage Vge2 is a control voltage that is applied between the gate electrode G and the emitter electrode E of the lower arm 20. The lower arm 20 turns on or off, depending on a voltage value of the gate voltage Vge2.

The driving circuit 34 is a driving part that periodically turns on and off the upper arm 10, following the command signal S1. To make the upper arm 10 periodically turn on and off, the driving circuit 34 outputs the control signal S9 that makes the upper arm 10 repeatedly turn on and off, for example, by a pulse modulation method, following the command signal S1 having pulse modulation applied. Specific examples of the pulse modulation include pulse width modulation (PWM), pulse frequency modulation (PFM), and the like. This is the same for the driving circuit 44.

The command signals S1 and S2 are signals supplied from a microcomputer that includes, for example, a CPU and the like. Note that the drive control circuits 30 and 40 by themselves may be microcomputers.

The drive control circuit 30 monitors a conduction state of the diode 11, and permits the upper arm 10 to turn on if conduction of the diode is not detected, or inhibits the upper arm 10 from turning on if conduction of the diode 11 is detected. This control can prevent, in a period during which a current having a predetermined current value or greater flows in the diode 11, the driving circuit 34 from having the state of the upper arm 10 switch from off to on even if the command signal S1 requesting the upper arm 10 to turn on is input into the driving circuit 34.

Similarly, the drive control circuit 40 monitors a conduction state of the diode 21, and permits the lower arm 20 to turn on if conduction of the diode 21 is not detected, or inhibits the lower arm 20 from turning on if conduction of the diode 21 is detected. This control can prevent, in a period during which a current having a predetermined current value or greater flows in the diode 21, the driving circuit 44 from having the state of the lower arm 20 switch from off to on even if the command signal 52 requesting the lower arm 20 to turn on is input into the driving circuit 44.

Figure 2A:
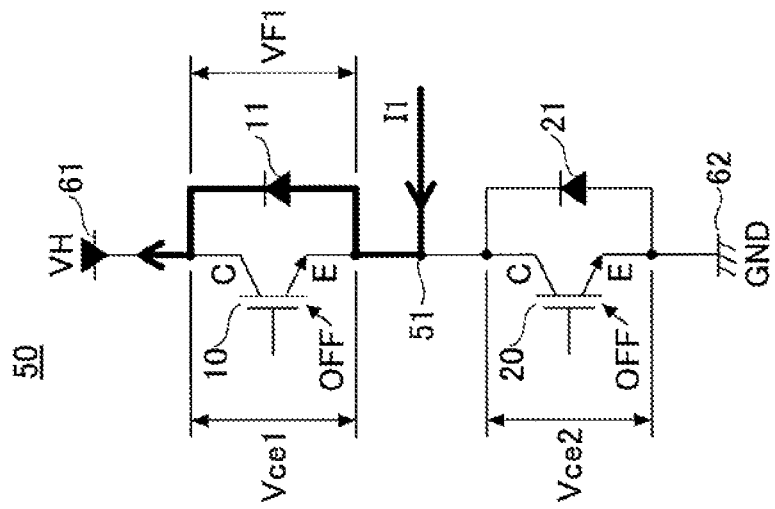
FIG. 2A is a diagram illustrating a current that flows in a period during which switching elements are off on both sides.
Figure 2B:
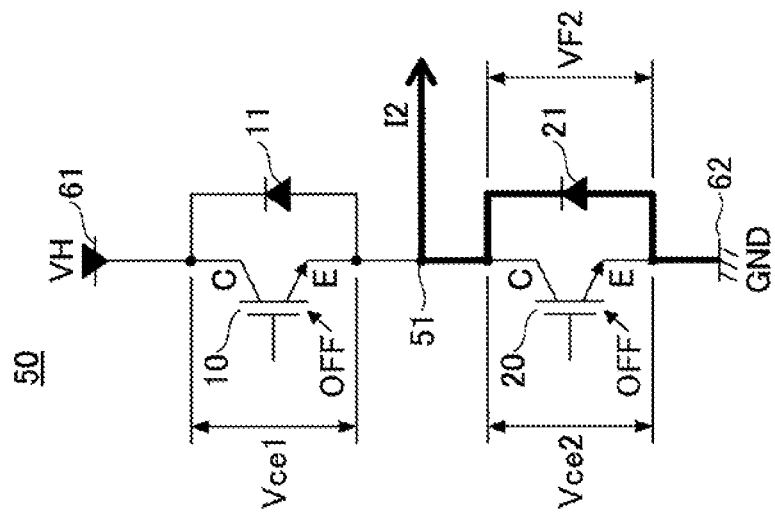
FIG. 2B is a diagram illustrating a current that flows in a period during which switching elements are off on both sides.

FIGS. 2A-2B are diagrams illustrating currents that flow in the arm circuit 50 for a period during which both the upper arm 10 and the lower arm 20 are turned off by the command signals S1 and S2 (dead time), respectively. In the dead time, one of a freewheel current I1 flowing in the diode 11, and a freewheel current I2 flowing in the diode 21 is generated. Vce1 represents a voltage between the collector electrode C and the emitter electrode E of the upper arm 10, and Vce2 represents a voltage between the collector electrode C and the emitter electrode E of the lower arm 20. VF1 represents the forward voltage of the diode 11, and VF2 represents the forward voltage of the diode 21.

During the dead time, the freewheel current I1 that is flowing makes the voltage Vce1 of the conducting diode 11 (see FIG. 2A) be equivalent to the forward voltage VF1 (or −VF1 if assuming that the emitter electrode E of the upper arm 10 takes a reference potential of zero). On the other hand, during the dead time, the freewheel current I2 that is flowing makes the voltage Vce1 of the non-conducting diode 11 (see FIG. 2B) be equivalent to the power supply voltage VH. Note that, strictly speaking, although the voltage Vce1 of the non-conducting diode 11 is a voltage obtained by subtracting the forward voltage VF2 from the power supply voltage VH, it is considered to be equivalent to the power supply voltage VH because the power supply voltage VH is sufficiently greater than the forward voltage VF2.

As such, there is a great voltage difference between the voltage Vce1 of the conducting diode 11, and the voltage Vce1 of the non-conducting diode 11. In addition, regardless of the magnitude of the current value of the current that flows in the diode 11, if the diode 11 is conducting, the voltage Vce1 during the dead time is equivalent to −VF1, or if the diode 11 is not conducting, the voltage Vce1 during the dead time is equivalent to VH.

Focusing on these points, the drive control circuit 30 detects whether the voltage Vce1 during the dead time is higher or lower than a predetermined value, to detect whether the diode 11 is conducting, and determines whether to permit the driving circuit 34 to turn on the upper arm 10.

Even if the current values of the freewheel currents I1 and I2 are comparatively small, the voltage Vce1 has a great voltage difference between when the diode 11 is conducting, and when not conducting. Therefore, detecting the voltage Vce1 during the dead time to detect whether the diode 11 is conducting, makes it less likely to have reduced detection precision to detect whether the diode 11 is conducting. Consequently, determination precision whether to permit the upper arm 10 to turn on is improved, and this makes it possible, for example, to avoid erroneously permitting the upper arm 10 to turn on even if the diode 11 is conducting.

Especially, if the upper arm 10 is a diode-built-in IGBT, and the upper arm 10 turns on in a period during which a current flows in the diode 11, the forward voltage VF1 of the diode 11 increases, and the forward direction loss of the diode 11 increases. However, the drive control circuit 30 monitors the voltage Vce1 during the dead time, and if detecting conduction of the diode 11, inhibits the upper arm 10 from turning on. Therefore, regardless of the magnitude of the current values of the freewheel currents I1 and I2, even if the current values of the freewheel currents I1 and I2 are comparatively small, the forward direction loss of the diode 11 can be prevented from increasing. Consequently, for example, the power consumption of an electronic control apparatus including the driving device 1 can be reduced, and further, it is possible to contribute improving the fuel efficiency of a vehicle that has the electronic control apparatus built in.

Similarly, during the dead time, the freewheel current I2 that is flowing makes the voltage Vce2 of the conducting diode 21 (see FIG. 2B) be equivalent to the forward voltage VF2 (or −VF2 if assuming that the emitter electrode E of the lower arm 20 takes a reference potential of zero). On the other hand, during the dead time, the freewheel current I1 that is flowing makes the voltage Vce2 of the non-conducting diode 21 (see FIG. 2A) be equivalent to the power supply voltage VH. Note that, strictly speaking, although the voltage Vce2 of the non-conducting diode 21 is a voltage obtained by subtracting the forward voltage VF1 from the power supply voltage VH, it is considered to be equivalent to the power supply voltage VH because the power supply voltage VH is sufficiently greater than the forward voltage VF1.

As such, there is a great voltage difference between the voltage Vce2 of the conducting diode 21, and the voltage Vce2 of the non-conducting diode 21. In addition, regardless of the magnitude of the current value of the current that flows in the diode 21, if the diode 21 is conducting, the voltage Vce2 during the dead time is equivalent to −VF2, or if the diode 21 is not conducting, the voltage Vce2 during the dead time is equivalent to VH.

Focusing on these points, the drive control circuit 40 detects whether the voltage Vce2 during the dead time is higher or lower than a predetermined value, to detect whether the diode 21 is conducting, and determines whether to permit the driving circuit 44 to turn on the lower arm 20.

Even if the current values of the freewheel currents I1 and I2 are comparatively small, the voltage Vce2 has a great voltage difference between when the diode 21 is conducting, and when not conducting. Therefore, detecting the voltage Vce2 during the dead time to detect whether the diode 21 is conducting, makes it hard to lower the detection precision to detect whether the diode 21 is conducting. Consequently, determination precision whether to permit the lower arm 20 to turn on is improved, and this makes it possible, for example, to avoid erroneously permitting the lower arm 20 turning on even if the diode 21 is conducting.

Especially, if the lower arm 20 is a diode-built-in IGBT, and the lower arm 20 turns on in a period during which a current flows in the diode 21, the forward voltage VF2 of the diode 21 increases, and the forward direction loss of the diode 21 increases. However, the drive control circuit 40 monitors the voltage Vce2 during the dead time, and if detecting conduction of the diode 21, inhibits the lower arm 20 from turning on. Therefore, regardless of the magnitude of the current values of the freewheel currents I1 and I2, even if the current values of the freewheel currents I1 and I2 are comparatively small, the forward direction loss of the diode 21 can be prevented from increasing. Consequently, for example, the power consumption of an electronic control apparatus including the driving device 1 can be reduced, and further, it is possible to contribute improving the fuel efficiency of a vehicle that has the electronic control apparatus built in.

If not restricting within the dead time, the voltage Vce between the collector and emitter of the transistor is −VF (for example, −1 V) while the diode is conducting; or the voltage Vce is the on voltage Von of the transistor (for example, 1 V), or the power supply voltage VH (for example, 600 V) while the diode is not conducting. Namely, the voltage Vce changes to take three voltage values. Since the voltage difference between −VF and Von is especially miniscule, it is not easy to correctly detect these two. However, in the present embodiment, the monitoring period of the voltage Vce is restricted within the dead time so that the voltage Vce takes one of −VF for the conducting diode, and VH for the non-conducting diode. Therefore, the conduction state of the diode can be determined by detecting the great voltage change.

In FIG. 1, the drive control circuit 30 includes a comparator 31 as a voltage detection part that detects the voltage Vce1 between the collector electrode C and the emitter electrode E of the upper arm 10. The comparator 31 is a monitor circuit to monitor the voltage Vce1 of the upper arm 10 at all times, and outputs a voltage detection signal S5 that changes depending on the magnitude of the voltage Vce1. The comparator 31 includes a non-inverting input part connected with the collector electrode C of the upper arm 10, and an inverting input part connected with the emitter electrode E of the upper arm 10 via a threshold voltage generation part 32. The threshold voltage generation part 32 is a circuit to generate a constant threshold voltage Vth1, and to apply it to the inverting input part of the comparator 31. The threshold voltage generation part 32 generates the threshold voltage Vth1, for example, by a resistive divider circuit. The threshold voltage Vth1, is set to a voltage value within a voltage range "−VF1<Vth1<VH".

If the voltage Vce1 is less than the threshold voltage Vth1, the comparator 31 outputs the voltage detection signal S5 at a low level. Especially, if the diode 11 is conducting during the dead time, the comparator 31 outputs the voltage detection signal S5 at the low level because the voltage Vce1 is equivalent to −VF1 that is less than the threshold voltage Vth1. Conversely, if the voltage Vce1 is greater than the threshold voltage Vth1, the comparator 31 outputs the voltage detection signal S5 at a high level. Especially, if the diode 11 is not conducting during the dead time, the comparator 31 outputs the voltage detection signal S5 at the high level because the voltage Vce1 is equivalent to VH that is greater than the threshold voltage Vth1.

Similarly, the drive control circuit 40 includes a comparator 41 as a voltage detection part that detects the voltage Vce2 between the collector electrode C and the emitter electrode E of the lower arm 20. The comparator 41 is a monitor circuit to monitor the voltage Vce2 of the lower arm 20 at all times, and outputs a voltage detection signal S6 that changes depending on the magnitude of the voltage Vce2. The comparator 41 includes a non-inverting input part connected with the collector electrode C of the lower arm 20, and an inverting input part connected with the emitter electrode E of the lower arm 20 via a threshold voltage generation part 42. The threshold voltage generation part 42 is a circuit to generate a constant threshold voltage Vth2, and to apply it to the inverting input part of the comparator 41. The threshold voltage generation part 42 generates the threshold voltage Vth2, for example, by a resistive divider circuit. The threshold voltage Vth2 is set to a voltage value within a voltage range "−VF2<Vth2<VH".

If the voltage Vce2 is less than the threshold voltage Vth2, the comparator 41 outputs the voltage detection signal S6 at the low level. Especially, if the diode 21 is conducting during the dead time, the comparator 41 outputs the voltage detection signal S6 at the low level because the voltage Vce1 is equivalent to −VF2 that is less than the threshold voltage Vth2. Conversely, if the voltage Vce2 is greater than the threshold voltage Vth2, the comparator 41 outputs the voltage detection signal S6 at the high level. Especially, if the diode 21 is not conducting during the dead time, the comparator 41 outputs the voltage detection signal S6 at the high level because the voltage Vce2 is equivalent to VH that is greater than the threshold voltage Vth2.

The drive control circuit 30 includes a D flip-flop 33 and an AND circuit 35 as a determination part to determine whether to permit the upper arm 10 to turn on, depending on a result of detecting the voltage Vce1 in the dead time. The D flip-flop 33 and the AND circuit 35 constitute a logic circuit to determine whether to permit the upper arm 10 to turn on, based on the command signal S1 requesting the upper arm 10 to turn on. Synchronizing with an input timing of the command signal S1 requesting the upper arm 10 to turn on, the D flip-flop 33 latches the voltage detection signal S5 output from the comparator 31, and hence, can obtain the voltage Vce1 detected by the comparator 31 during the dead time. Based on the obtained result, the D flip-flop 33 determines whether to permit the upper arm 10 to turn on, and holds the determination result of the permission or inhibition, until receiving the next input of the command signal S1 requesting the upper arm 10 to turn on.

The D flip-flop 33 determines whether to permit the upper arm 10 to turn on, based on a comparison result between the voltage Vce1 detected during the dead time, and a predetermined value.

If detecting that the voltage Vce1 detected during the dead time is equivalent to the power supply voltage VH, which is greater than or equal to the threshold voltage Vth1, the D flip-flop 33 determines that the diode 11 is not conducting, and outputs the permission determination signal S7 at the high level to permit the upper arm 10 to turn on.

On the other hand, if detecting that the voltage Vce1 detected during the dead time is equivalent to the forward voltage VF1, which is less than the threshold voltage Vth1, the D flip-flop 33 determines that the diode 11 is conducting, and outputs the permission determination signal S7 at the low level to inhibit the upper arm 10 from turning on. Thus, even if the driving circuit 34 outputs the control signal S9 at the high level to have the upper arm 10 turn on following the command signal S1 requesting the upper arm 10 to turn on, the AND circuit 35 inhibits the upper arm 10 from turning on. For a period during which the D flip-flop 33 outputs the permission determination signal S7 at the low level that inhibits the upper arm 10 from turning on, the gate voltage Vge1 at the low level to have the upper arm 10 turn off is output from the drive control circuit 30 by the AND circuit 35. Thus, even if the command signal S1 requesting the upper arm 10 to turn on is input, the upper arm 10 does not turn on, and the off state is maintained.

A D flip-flop 43 and an AND circuit 45 that are included in the drive control circuit 40 are virtually the same as the D flip-flop 33 and the AND circuit 35 described above.

Figure 3:
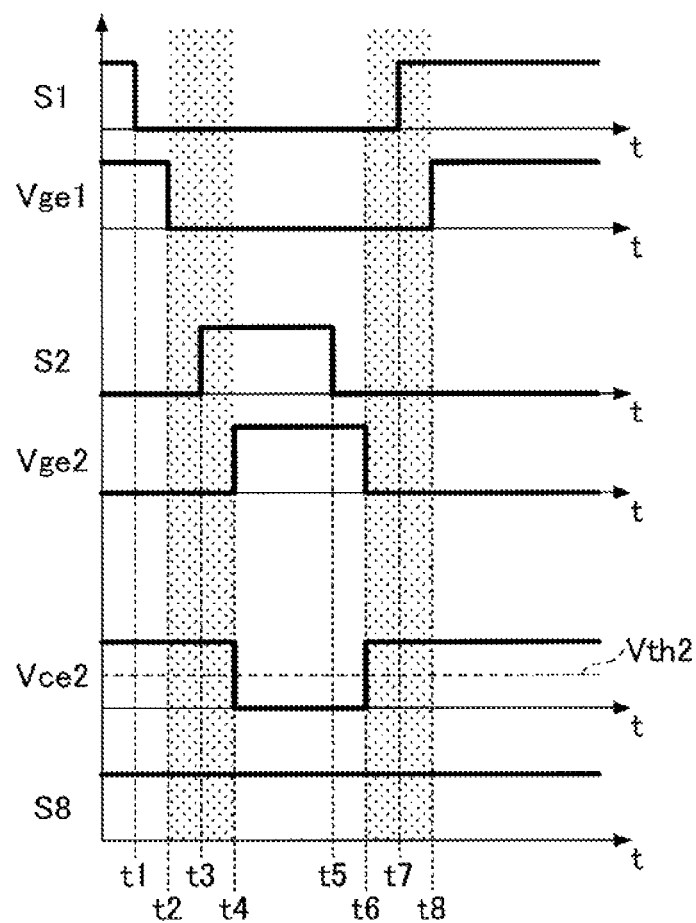

FIG. 3 is a timing chart, when the D flip-flop 43 and the AND circuit 45 permit the lower arm to turn on, in the case of FIG. 2A where the current does not flow in the diode 21 during the dead time. A period t2-t4 and a period t6-t8 are the dead times. FIG. 3 will be described with reference to FIG. 1 and FIG. 2A.

A time lag t1-t2 exists after the command signal S1 requesting the upper arm 10 to turn off has been input into the driving circuit 34, until the upper arm 10 actually turns off. Similarly, a time lag t3-t4 exists after the command signal S2 requesting the lower arm 20 to turn off has been input into the driving circuit 44, until the lower arm 20 actually turns off. Therefore, the dead time during which both the upper arm 10 and the lower arm 20 turn off corresponds to the period t2-t4.

A timing t3 when the command signal S2 requesting the lower arm 20 to turn off is input into the driving circuit 44 exists within the dead time t2-t4. Taking advantage of this point, the D flip-flop 43 detects the voltage Vce2 by using a rising input edge of the command signal S2 requesting the lower arm 20 to turn on as a trigger, and hence, can securely detect the voltage Vce2 at the timing t3 in the dead time t2-t4.

Although the upper arm 10 switches from on to off at the timing t2, once the freewheel current I1 starts flowing in the diode 11 as illustrated in FIG. 2A, the voltage Vce2 stays at the power supply voltage VH, and hardly changes before and after the timing t2. In addition, during the dead time t2-t4, the voltage Vce2 is equivalent to the power supply voltage VH because the freewheel current I1 continues to flow in the diode 11.

Therefore, the D flip-flop 43 latches at the timing t3 the voltage detection signal S6 at the high level, which is output from the comparator 41, and outputs the permission determination signal S8 at the high level to permit the lower arm 20 to turn on. The D flip-flop 43 continuously outputs the permission determination signal S8 at the high level to permit the lower arm 20 to turn on, until at least the rising input edge of the command signal S2 requesting the lower arm 20 to turn on in the next cycle. For a period during which the lower arm 20 is permitted to turn on, the lower arm 20 turns on and off as requested by the command signal S2.

Figure 4:
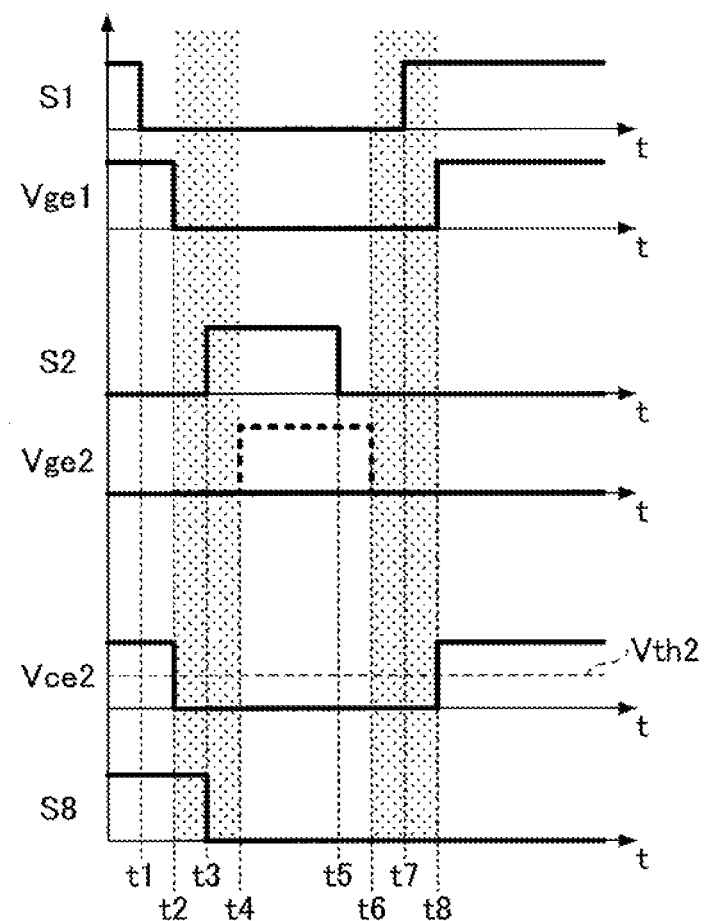

FIG. 4 is a timing chart, when the D flip-flop 43 and the AND circuit 45 inhibits the lower arm 20 from turning on, in the case of FIG. 2B where the current flows in the diode 21 during the dead time. The period t2-t4 and the period t6-t8 are the dead times. FIG. 4 will be described with reference to FIG. 1 and FIG. 2A.

Although the upper arm 10 switches from on to off at the timing t2, once the freewheel current I2 starts flowing in the diode 21 as illustrated in FIG. 2B, the voltage Vce2 changes from VH to −VF2 at the timing t2. In addition, during the dead time t2-t4, the voltage Vce2 is equivalent to −VF2 because the freewheel current I2 continues to flow in the diode 21.

Therefore, the D flip-flop 43 latches at the timing t3 the voltage detection signal S6 at the low level, which is output from the comparator 41, and outputs the permission determination signal S8 at the low level to inhibit the lower arm 20 from turning on. The D flip-flop 43 continuously outputs the permission determination signal S8 at the low level to inhibit the lower arm 20 from turning on, until at least the rising input edge of the command signal S2 requesting the lower arm 20 to turn on in the next cycle. For a period during which the lower arm 20 is inhibited from turning on, even if the command signal S2 is input, the gate voltage Vge2 is fixed at the low level by the AND circuit 45, and the lower arm 20 does not turn on and is fixed in the off state.

It is the same for the D flip-flop 33 and the AND circuit 35 when determining whether to permit the upper arm 10 to turn on.

For example, in FIG. 3, a time lag t5-t6 exists after the command signal S2 requesting the lower arm 20 to turn off has been input into the driving circuit 44, until the lower arm 20 actually turns off. Similarly, a time lag t7-t8 exists after the command signal S1 requesting the upper arm 10 to turn off has been input into the driving circuit 34, until the upper arm 10 actually turns off. Therefore, the dead time during which both the upper arm 10 and the lower arm 20 turn off corresponds to the period t6-t8.

A timing t7 when the command signal S1 requesting the upper arm 10 to turn on is input into the driving circuit 44 exists within the dead time t6-t8. Taking advantage of this point, the D flip-flop 33 detects the voltage Vce1 by using a rising input edge of the command signal S1 requesting the upper arm 10 to turn on as a trigger, and hence, can securely detect the voltage Vce1 at the timing t7 in the dead time t6-t8.

Although the lower arm 20 switches from on to off at the timing t2, once the freewheel current I1 starts flowing in the diode 11 as illustrated in FIG. 2A, the voltage Vce1 changes from VH to −VF1 at the timing t6. In addition, during the dead time t6-t8, the voltage Vce1 is equivalent to −VF1 because the freewheel current I1 continues to flow in the diode 11.

Therefore, the D flip-flop 33 latches at the timing t7 the voltage detection signal S5 at the low level, which is output from the comparator 31, and outputs the permission determination signal S7 at the low level to inhibit the upper arm 10 from turning on. The D flip-flop 33 continuously outputs the permission determination signal S7 at the low level to inhibit the upper arm 10 from turning on, until at least the rising input edge of the command signal S1 requests the upper arm 10 to turn on in the next cycle. For a period during which the upper arm 10 is inhibited from turning on, even if the command signal S1 is input, the gate voltage Vge1 is fixed at the low level by the AND circuit 35, and the upper arm 10 does not turn on and is fixed in the off state.

On the other hand, although the lower arm switches from on to off at the timing t6, once the freewheel current I2 starts flowing in the diode 12 as illustrated in FIG. 2B, the voltage Vce1 stays at the power supply voltage VH, and hardly changes before and after the timing t6. In addition, during the dead time t6-t8, the voltage Vce1 is equivalent to the power supply voltage VH because the freewheel current I2 continues to flow in the diode 21.

Therefore, the D flip-flop 33 latches at the timing t7 the voltage detection signal S7 at the high level, which is output from the comparator 31, and outputs the permission determination signal S7 at the high level to permit the upper arm 10 to turn on. The D flip-flop 33 continuously outputs the permission determination signal S7 at the high level to permit the upper arm 10 to turn on, until at least the rising input edge of the command signal S1 requests the upper arm 10 to turn on in the next cycle. For a period during which the upper arm 10 is permitted to turn on, the upper arm 10 turns on and off as requested by the command signal S1.

Note that the frequencies of the command signals S1 and S2 are sufficiently higher than the frequency of a sinusoidal current that flows in the inductive load 70. Therefore, as in the present embodiment, determining the conduction state of the diode every dead time, to turn off the upper arm or the lower arm, has virtually no influence on the sinusoidal current that flows in the inductive load 70.

Figure 5:
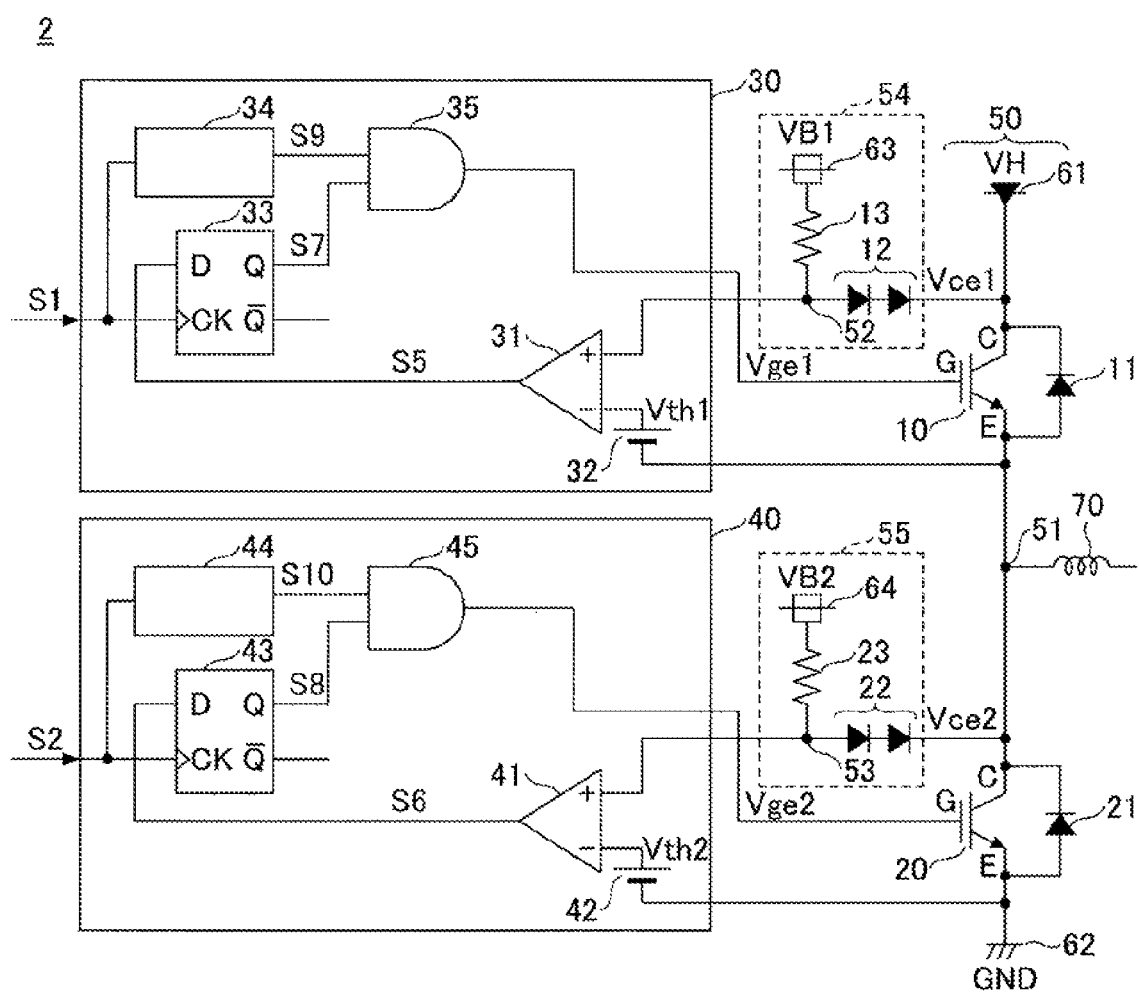
FIG. 5 is a configuration diagram illustrating a driving device according to a second embodiment.

FIG. 5 is a configuration diagram illustrating a driving device 2 according to a second embodiment. The configuration and effects that are substantially the same as in the embodiment described above will be omitted or simplified. In the driving device 2, level shift circuits 54 and 55 are added to the configuration of the driving device in FIG. 1. The driving device 2 includes the level shift circuit 54 as a level shift part to shift the level of the voltage Vce1, and includes the level shift circuit 55 as a level shift part to shift the level of the voltage Vce2.

The level shift circuit 54 includes a diode 12 that is connected between the collector electrode C of the upper arm 10 and a reference voltage source 63. The reference voltage source 63 outputs a reference voltage VB1 that is lower than the power supply voltage VH. The ground of the reference voltage source 63 is the ground of the comparator 31 of the drive control circuit 30, and is, for example, the emitter electrode E of the upper arm 10 or the intermediate node 51.

The reference voltage VB1 is set to a voltage, for example, within a voltage range that can be detected by the comparator 31 (for example, 12 V). If the reference voltage source 63 is, for example, a floating power source that can adjust the reference voltage VB1, it is possible to adjust it to an arbitrary voltage within the voltage range that can be detected by the comparator 31.

The cathode of the diode 12 is connected with the collector electrode C of the upper arm 10, and the connection point is preferably very close the collector electrode C. The anode of the diode 12 is connected with the reference voltage source 63 by a pull-up connection via a resistor 13. A connection node 52 between the anode of the diode 12 and the resistor 13 is connected with the non-inverting input part of the comparator 31. The number of diodes 12 connected in series may be one or more.

The level shift circuit 55 includes a diode 22 that is connected between the collector electrode C of the lower arm 20 and a reference voltage source 64. The reference voltage source 64 outputs a reference voltage VB2 that is lower than the power supply voltage VH. The ground of the reference voltage source 64 is the ground of the comparator 41 of the drive control circuit 40, and is, for example, the emitter electrode E of the lower arm 20, or the power source potential part 62.

The reference voltage VB2 is set to a voltage, for example, within a voltage range that can be detected by the comparator 41 (for example, 12 V). If the reference voltage source 64 is, for example, a floating power source that can adjust the reference voltage VB2, it is possible to adjust it to an arbitrary voltage within the voltage range that can be detected by the comparator 41. The voltage value of the reference voltage VB2 may be the same as that of the reference voltage VB1, or may be different.

The cathode of the diode 22 is connected with the collector electrode C of the lower arm 20, and the connection point is preferably very close the collector electrode C. The anode of the diode 22 is connected with the reference voltage source 64 by a pull-up connection via a resistor 23. The connection node 53 between the anode of the diode 22 and the resistor 23 is connected with the non-inverting input part of the comparator 41. The number of diodes 22 connected in series may be one or more.

During the dead time, if the diode 11 is not conducting and the diode 21 is conducting, the voltage Vce1 is equivalent to VH. Therefore, the relationship of VB1<VH is satisfied, and hence, the diode 12 turns off. Consequently, the input voltage of the non-inverting input part side of the comparator 31 is VB1, and hence, the non-conduction state of the diode 11 can be detected by the voltage within the voltage range that can be detected by the comparator 31.

On the other hand, during the dead time, if the diode 21 is not conducting and the diode 11 is conducting, the voltage Vce1 is equivalent to −VF1. Therefore, the relationship of VB1>−VF1 is satisfied, and hence, the diode 12 turns on. Consequently, the forward voltage of the diode 12 and the forward voltage of the diode 11 cancel each other, and hence, the input voltage of the non-inverting input part side of the comparator 31 does not take a negative voltage but 0 V. Therefore, the conduction state of the diode 11 can be detected by the voltage within the voltage range that can be detected by the comparator 31.

During the dead time, the relationship between the comparator 41 and the level shift circuit 55 is the same as above.

By including the level shift circuits 54 and 55, the drive control circuits 30 and 40 can lower the voltage resistance. Especially, since the negative voltage (−VF) generated at the diodes 11 and 21 for reverse conducting can be canceled by the forward voltage of the diodes 12 and 22, the circuit configuration of the comparators 31 and 41 can be simplified.

Although the driving device and the switching circuit control method have been described with the exemplary embodiments as above, the present invention is not limited to the above exemplary embodiments. Various modifications and improvements can be made within the scope of the present invention by combining and/or replacing a part of or all of the exemplary embodiments with the others.

For example, the switching elements are not limited to IGBTs, but may be N-channel MOSFETs or P-channel MOSFETs.

Note that this International Application is based upon and claims the benefit of priority of Japanese Priority Application No. 2013-094312 filed on Apr. 26, 2013, the entire contents of which are hereby incorporated by reference.

DESCRIPTION OF REFERENCE SYMBOLS 1, 2 driving device
10 upper arm
11, 12, 21, 22 diode
13, 23 resistor
20 lower arm
30, 40 drive control circuit
31, 41 comparator
32, 42 threshold voltage generation part
33, 43 D flip-flop
34, 44 driving circuit
35, 45 AND circuit
50 arm circuit
51 intermediate node
52, 53 connection node
54, 55 level shift circuit
61, 62 power source potential part
63, 64 reference voltage source
70 load

The invention claimed is:

1. A driving device, comprising:
a switching circuit configured to have switching elements disposed on a high side and a low side, the switching element including a first electrode, a second electrode, and a reverse conducting element disposed between the first electrode and the second electrode; and
a determination part configured to determine whether to permit the switching element to turn on, based on (1) a command signal requesting the switching element to turn on and (2) a result obtained by detecting a voltage between the first electrode and the second electrode, in a period during which the switching elements on both sides are off.

2. The driving device, as claimed in claim 1, wherein the determination part determines whether to permit the switching element to turn on, based on a result obtained by comparing the voltage detected in the period, with a predetermined value.

3. The driving device, as claimed in claim 2, wherein the determination part inhibits the switching element from turning on, when the voltage detected in the period is less than the predetermined value.

4. The driving device, as claimed in claim 2, wherein the determination part permits the switching element to turn on when the voltage detected in the period is greater than or equal to the predetermined value.

5. The driving device, as claimed in claim 1, wherein the determination part inhibits the switching element from turning on, when detecting that the voltage detected in the period is equivalent to a forward voltage of the reverse conducting element.

6. The driving device, as claimed in claim 1, wherein the determination part permits the switching element to turn on, when detecting that the voltage detected in the period is equivalent to a power supply voltage of the switching elements.

7. The driving device, as claimed in claim 1, wherein the voltage is detected, synchronized with the command signal.

8. The driving device, as claimed in claim 1, wherein the determination part holds the determination result of the permission or inhibition until receiving a next input of the command signal.

9. The driving device, as claimed in claim 1, wherein the determination part does not have the switching element turn on, when the switching element is inhibited from turning on, even when receiving a command signal requesting the switching element to turn on.

10. The driving device, as claimed in claim 1, further comprising:
   a driving part configured to have the switching elements turn on, following a command signal requesting the switching element to turn on,
   wherein the determination part has the driving part determine whether to permit the switching element to turn on.

11. The driving device, as claimed in claim 1, further comprising:
   a level shift part configured to shift a level of the voltage; and
   a voltage detection part configured to receive an output voltage of the level shift part, as input,
   wherein the level shift part includes a diode being connected between a higher potential electrode among the first electrode and the second electrode, and a reference voltage source outputting a reference voltage lower than a power supply voltage of the switching element.

12. The driving device, as claimed in claim 11, wherein the voltage detection part is a comparator.

13. The driving device, as claimed in claim 1, wherein the switching element is a diode-built-in IBGT.

14. A control method of a switching circuit configured to have switching elements disposed on a high side and a low side, the switching element including a first electrode, a second electrode, and a reverse conducting element disposed between the first electrode and the second electrode, the method comprising:
   determining whether to permit the switching element to turn on, based on (1) a command signal requesting the switching element to turn on and (2) a result obtained by detecting a voltage between the first electrode and the second electrode, in a period during which the switching elements on both sides are off.

* * * * *